(12) United States Patent
Rogachevskiy et al.

(10) Patent No.: US 12,253,807 B2
(45) Date of Patent: Mar. 18, 2025

(54) HEIGHT MEASUREMENT METHOD AND HEIGHT MEASUREMENT SYSTEM

(71) Applicant: ASML Netherlands B.V., Veldhoven (NL)

(72) Inventors: Andrey Valerievich Rogachevskiy, Den Bosch (NL); Bastiaan Andreas Wilhelmus Hubertus Knarren, Nederweert-Eind (NL); Doru Cristian Torumba, Veldhoven (NL); Arjan Gijsbertsen, Vught (NL); Cristina Caresio, Eindhoven (NL); Raymund Centeno, Nijmegen (NL); Tabitha Wangari Kinyanjui, Heumen (NL); Jan Arie Den Boer, Strijen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 93 days.

(21) Appl. No.: 18/000,299

(22) PCT Filed: Apr. 19, 2021

(86) PCT No.: PCT/EP2021/060040
§ 371 (c)(1),
(2) Date: Nov. 30, 2022

(87) PCT Pub. No.: WO2021/249682
PCT Pub. Date: Dec. 16, 2021

(65) Prior Publication Data
US 2023/0244153 A1 Aug. 3, 2023

(30) Foreign Application Priority Data
Jun. 10, 2020 (EP) .................................... 20179379

(51) Int. Cl.
*G03F 9/00* (2006.01)
*G01C 5/00* (2006.01)
*G06T 7/246* (2017.01)

(52) U.S. Cl.
CPC ............. *G03F 9/7034* (2013.01); *G01C 5/00* (2013.01); *G03F 9/7026* (2013.01);
(Continued)

(58) Field of Classification Search
CPC .... G03F 9/7034; G03F 9/7026; G03F 9/7046; G03F 9/7092; G03F 9/7019; G03F 7/70783; G01C 5/00; G06T 7/246
See application file for complete search history.

(56) References Cited

U.S. PATENT DOCUMENTS 6,952,253 B2    10/2005 Lof et al.
7,012,672 B2 *  3/2006 Van Rhee ........... G03F 7/70508
                                                   356/601
(Continued)

FOREIGN PATENT DOCUMENTS

JP    2020-027866 A    2/2020
KR   2018-0121589 A    11/2018
(Continued)

OTHER PUBLICATIONS

International Search Report and Written Opinion of the International Searching Authority directed to related International Patent Application No. PCT/EP2021/060040, mailed Jul. 6, 2021; 9 pages.
(Continued)

*Primary Examiner* — Hung V Nguyen
(74) *Attorney, Agent, or Firm* — Sterne, Kessler, Goldstein & Fox P.L.L.C.

(57) ABSTRACT

The present invention provides a method for calculating a corrected substrate height map of a first substrate using a height level sensor. The method comprises: sampling the first substrate by means of the height level sensor with the first substrate moving with a first velocity, wherein the first velocity is a first at least partially non-constant velocity of the first substrate with respect to the height level sensor, to generate a first height level data, generating a first height map based on the first height level data, and calculating a corrected substrate height map by subtracting a correction map from the first height map, wherein the correction map is calculated from the difference between a first velocity height map and a second velocity height map.

6 Claims, 4 Drawing Sheets

(52) U.S. Cl.
CPC .......... *G03F 9/7046* (2013.01); *G03F 9/7092* (2013.01); *G06T 7/246* (2017.01); *G03F 9/7019* (2013.01)

(56) References Cited

U.S. PATENT DOCUMENTS

| | | | |
|---|---|---|---|
| 7,098,455 B2* | 8/2006 | Shinada | H01J 37/28 250/310 |
| 8,411,254 B2* | 4/2013 | De Nivelle | G03B 27/42 355/53 |
| 10,324,045 B2 | 6/2019 | Cui et al. | |
| 10,558,130 B2* | 2/2020 | Queens | G03F 9/7026 |
| 10,684,557 B2 | 6/2020 | Queens et al. | |
| 10,768,533 B2 | 9/2020 | Xiao et al. | |
| 11,317,500 B2 | 4/2022 | Khodykin | |
| 2006/0103819 A1 | 5/2006 | Butler et al. | |
| 2009/0325087 A1 | 12/2009 | Lyons | |
| 2010/0053582 A1 | 3/2010 | De Nivelle | |
| 2011/0167525 A1* | 7/2011 | Humphris | G01Q 10/065 850/33 |
| 2014/0092374 A1 | 4/2014 | Sato | |
| 2020/0144591 A1 | 5/2020 | Wang et al. | |
| 2020/0173940 A1 | 6/2020 | Kooiman | |

FOREIGN PATENT DOCUMENTS

| | | |
|---|---|---|
| TW | 2018-07765 A | 3/2018 |
| TW | 2018-27812 A | 8/2018 |

OTHER PUBLICATIONS

International Preliminary Report on Patentability directed to International Patent Application No. PCT/EP2021/060040, issued Dec. 13, 2022; 7 pages.

Korean Office Action directed to Korean Patent Application No. 2022-7043103, mailed Jan. 14, 2025; 14 pages.

\* cited by examiner

Fig. 5B

HEIGHT MEASUREMENT METHOD AND HEIGHT MEASUREMENT SYSTEM

CROSS-REFERENCE TO RELATED APPLICATIONS

This application claims priority of EP application 20179379.1 which was filed on 10 Jun. 2020, and which is incorporated herein in its entirety by reference.

FIELD

The present invention relates to a method and a system for measuring a height of a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

A lithographic apparatus may include an illumination system configured to condition a radiation beam before the radiation beam reaches the patterning device. Once the radiation beam has been patterned by the patterning device, a projection system directs the radiation beam to the substrate. Before exposure of the substrate to transfer the pattern onto the substrate, a height level of the substrate may be determined and mapped. A resulting height map of the substrate may be employed to position the substrate with respect to a projection system, for example.

In a conventional lithographic apparatus, the height map may be generated by sampling the height of the substrate at predetermined equidistant positions, e.g., positions lying on a rectangular measurement grid. A height level sensor and the substrate may be moved with respect to each other along a trajectory, which trajectory is selected along the predetermined positions. In the conventional lithographic apparatus, the measurement samples are taken while the substrate and the height level sensor move with respect to each other at a constant velocity. Thus, the height level sensor samples the equidistant measurement positions by sampling at a constant sampling rate. It is noted that in the measuring process the substrate or the height level sensor or both may move.

To decrease a measurement duration of a measurement system taking measurement samples of an object moving with respect to said measurement system, the measurement system may be configured to take measurement samples at different sample positions while the object accelerates with respect to the measurement system, as for example disclosed in US2006/0103819. In particular, a measurement timing for taking samples is determined corresponding to a selected acceleration and velocity of the object as a function of time with respect to the measurement system.

In the above-described height measurement method and height measurement system, the measurement samples are not taken equidistant and are sensitive to acceleration induced deformations of, for example, the substrate. Thus, the obtained height map will be governed by a non-uniform sample distribution and temporal height variation of the substrate under influence of acceleration forces (dynamic effects).

SUMMARY

An object of the present invention is to provide a height measurement method and a height measurement system for obtaining a height map with minimum impact of the dynamic effects.

According to an embodiment of the invention, there is provided a method for calculating a corrected substrate height map of a first substrate using a height level sensor. The method including sampling of the first substrate by means of the height level sensor with the first substrate moving with a first velocity, wherein the first velocity is a first at least partially non-constant velocity of the first substrate with respect to the height level sensor, to generate a first height level data; generating a first height map based on the first height level data; and calculating a corrected substrate height map by subtracting a correction map from the first height map, wherein the correction map is calculated from the difference between a first velocity height map and a second velocity height map.

In an embodiment of the invention, the first velocity height map may be derived from at least one height map of at least a second substrate measured with a velocity corresponding to the first velocity, and the second velocity height map may be derived from at least one height map of at least the second substrate measured with a second velocity, the second velocity may be a second at least partially non-constant velocity of a lower amplitude with respect to the first velocity.

The sampling may at least partially performed at moments in time at which the first substrate and the height level sensor accelerate with respect to each other, resembling the non-constant velocity of the substrate during the height measurements.

According to an embodiment of the invention, there is provided a system for measuring a height of a first substrate The system comprises a height level sensing controller that configured to receive first height level data for the first substrate, to generate first height map data based on the first height level data, and to correct the first height map data with correction map data, wherein the correction map data may be calculated from a difference between a first velocity height map and a second velocity height map.

The first velocity height map may be derived from at least one height map of at least a second substrate measured with a velocity corresponding to the first velocity, and the second velocity height map may be derived from at least one height map of at least the second substrate measured with a second velocity. The second velocity may be a second at least partially non-constant velocity of a lower amplitude with respect to the first velocity.

In an embodiment, a lithographic apparatus comprising the system for measuring the height of the first substrate.

Further embodiments, features and advantages of the present invention, as well as the structure and operation of the various embodiments, features and advantages of the present invention, are described in detail below with reference to the accompanying drawings.

BRIEF DESCRIPTION OF THE DRAWINGS

Embodiments of the invention will now be described, by way of example only, with reference to the accompanying schematic drawings, in which.

The features shown in the figures are not necessarily to scale, and the size and/or arrangement depicted is not limiting. It will be understood that the figures include optional features, which may not be essential to the invention. Furthermore, not all of the features of the system and/or lithographic apparatus are depicted in each of the figures, and the figures may only show some of the components relevant for a describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
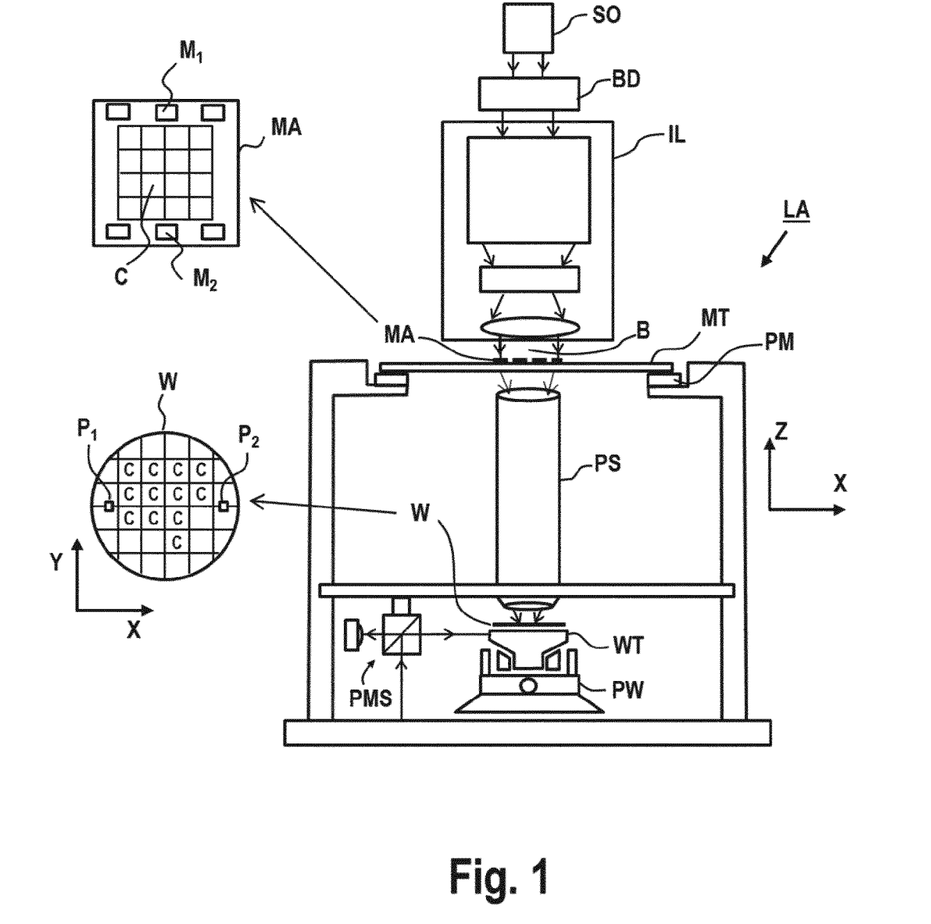
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In one example, a lithographic apparatus LA such as a scanner can include a height level sensor (or height sensor) to measure the height of a substrate surface before exposure. The lithographic apparatus LA can use this measurement: (i) to calculate the expose profiles followed by the substrate support during the exposure (and, in some aspects, projection system characteristics); and (ii) for diagnostics on leveling and focus errors made during exposure. The height level sensor can control the substrate support while trying to keep the substrate in focus while measuring the substrate height map. The height level sensor capture is the initial measurement to find the surface of the substrate.

With increasing device topography, especially in 3D NAND memory arrays, the requirements of the height level sensor become more stringent, both in terms of range and resolution. On KrF systems, for example, device topographies can have steps of multiple microns, such as when fabricating staircase structures. Other 3D NAND memory arrays on ArF and ArFi systems are typically planarized, having topographies of up to 200 nm. In another example, device topographies of over 20 microns are expected in the near future, and device topographies of over 40 microns (e.g., based on a minimum of around 800 layers, where each layer is at least about 50 nm thick) are expected in the long term.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In conventional lithographic apparatus, the height level sensor is to sample the height of the substrate at equidistant predetermined positions and the height level sensor samples at a constant sampling rate. Therefore, it is desirable that the substrate moves with a constant velocity during sampling. To obtain a full map of the substrate, the substrate accelerates and deaccelerates when the height level sensor is not positioned for sampling, also known as a run-in distance, of each straight trajectory, which typically lies outside a measurement area of the substrate. As the substrate is positioned in the measurement range of the height level sensor, the substrate typically moves at a constant velocity and the height of the substrate is measure by means of the height level sensor.

Due to the limited moving range of the substrate within the lithographic apparatus, there is only limited run-in distance. Thus, a velocity of the substrate is limited to a maximum velocity due to the limited moving range. If a higher constant velocity would be desired, a larger run-in distance would be required.

Figure 2A:
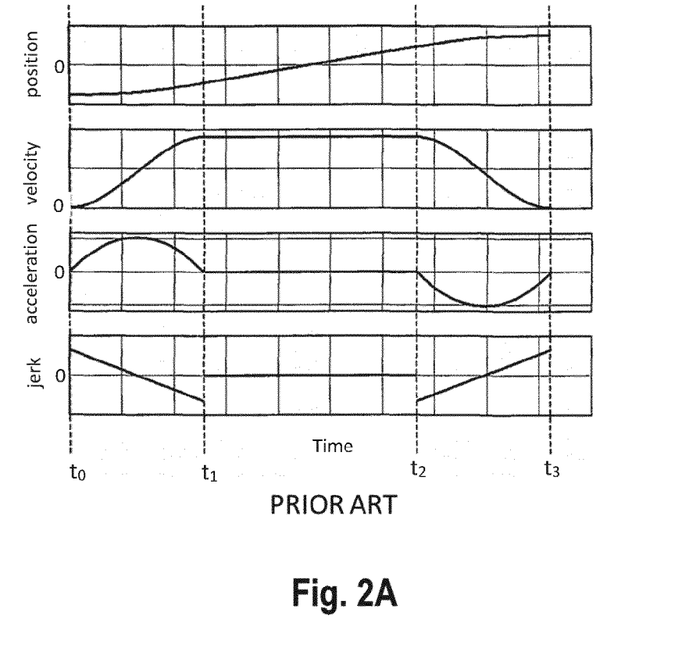
FIG. 2A depicts timing charts of a conventional scanning measurement method.

It would be beneficial to shorten the total measurement period by increasing the maximum velocity, but without increasing the run-in distance. This may be enabled by sampling the substrate, while the substrate accelerates. An example of timing charts that may be used in case of such a measurement scenario is illustrated by FIG. 2A. FIG. 2A depicts the position, velocity, acceleration, and jerk of the substrate relative to the height level sensor as a function of time.

At t0, the substrate may be in standstill and is positioned with respect to the height level sensor such that the height level sensor may start to sample. At t0, the substrate starts to accelerate in accordance with a selected acceleration function. Due to the acceleration, the velocity increases and the position increases. During the acceleration period, the measurement sensor may take samples, i.e., measurements at predetermined positions. In order to have the samples taken at equidistant positions these sample have to be taken in non-equal periods of time therebetween. However, typically (and beneficially) the sampling is performed at a constant sampling rate. During a constant velocity part of a trajectory, after t1, the velocity is constant and therefore, the position is a first order polynomial, i.e., linear function of time. After t2, the substrate decelerates corresponding to a selected second order polynomial function, until the velocity becomes zero again at t3.

Figure 2B:
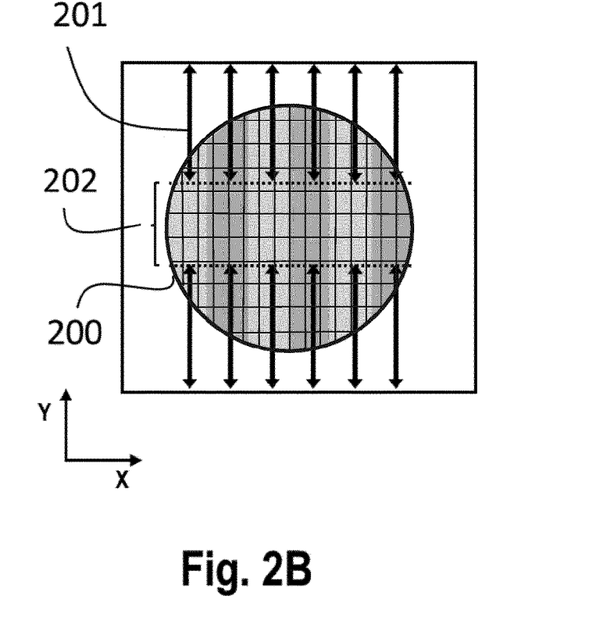
FIG. 2B illustrates a measurement trajectory according the timing charts of FIG. 2A.

FIG. 2B illustrates the dynamic trajectory of the measurement scenario of FIG. 2A mapped on a substrate 200. The arrows 201 illustrate the measurement scans during a height level measurement. During the time period between t0 and t1 as well as between t2 and t3 the substrate moves at a non-constant velocity with respect to the height level sensor. These trajectories with non-constant velocity are illustrated by the solid arrows 201. In the time period between t1 and t2, the substrate moves at a constant velocity with respect to the height level sensor. The constant velocity area 202 at the wafer is typically located around the centre part of the wafer (in Y-direction).

Figure 3:
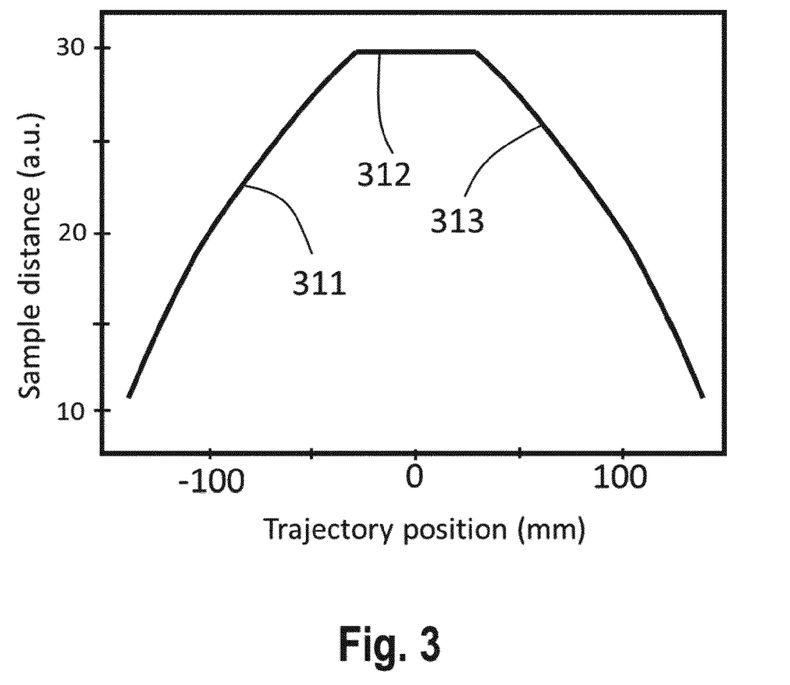
FIG. 3 depicts a sample distance as a function of trajectory position according the measurement trajectory of FIG. 2A.

Since the measurement samples are typically taken at a constant sampling rate, the measurement samples are not taken at equidistant positions. FIG. 3 depicts an exemplary graph, illustrating a sample distance, i.e., a distance between two sequential measurement sample at the substrate, as a function of a position along the scan trajectory. As the height measurements at the wafer start, the velocity of the substrate with respect to the height level sensor may not be constant and the velocity may still increase (referring to FIG. 2A, corresponding to the period between t0 and t1). Herewith, the sample distance is not constant, instead the sample distance increases, as is illustrated by the inclining part 311 of the curve. As the substrate reaches a constant velocity, the sample distance becomes constant, as illustrated by the horizontal and straight part of the curve 312 (referring to FIG. 2A, corresponding to the period between t1 and t2). At a certain moment, the substrate starts to decelerate (referring to FIG. 2A, corresponding to the period between t2 and t3), and the sample distance is again not constant, instead the sample distance decrease, as is illustrated by the declining part 313 of the curve.

As illustrated by FIG. 3, the measurement positions (or the sample positions) are not equidistant. Thus, performing a height measurement by using the timing charts as depicted by FIG. 2A, it results in a measurement grid (and herewith a substrate height map) that would have a denser sampling at the start and at the end of the measurement trajectory with respect to the centre part of the measurement trajectory. Thus, the sampling density is governed by the local (or the temporal) velocity of the substrate with respect to the height level sensor at the moment of that the measurement is performed.

In addition to the sampling density, height level measurements performed at a non-constant velocity of the substrate with respect to the height level sensor (here also taking into account the transition between a non-constant velocity to a constant velocity, and vice versa) are typically affected by deformations of moving parts. That is, typically, acceleration on the wafer is not desired since the substrate support that supports the substrate deforms under force, which can be described by Newton's second law, $F=m \cdot a$. Thus, there will be force acting on the substrate support as well on the substrate that is being measured. This leads to height errors in the measured height map. This eventually may result in defocus during the exposure phase.

Figure 4:
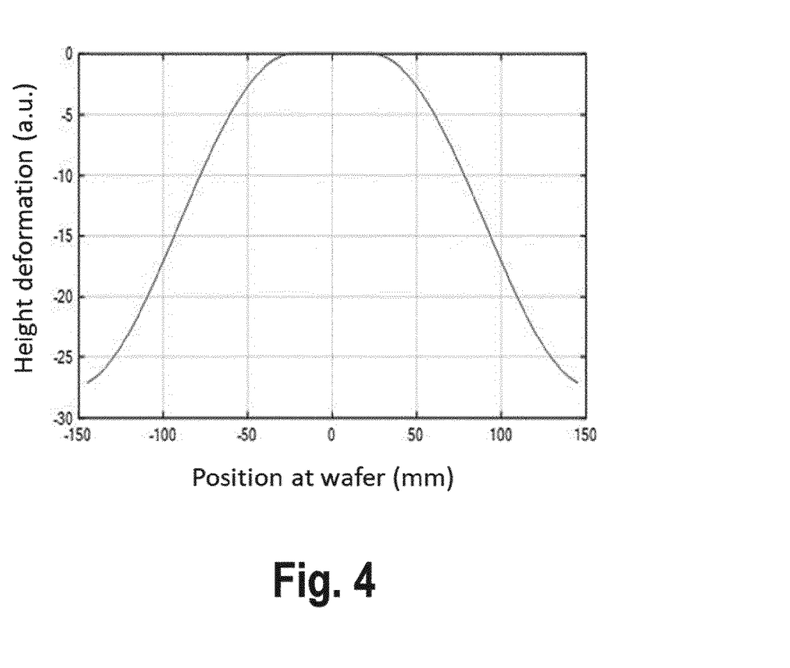
FIG. 4 depicts measured height deformations as a function of trajectory position according the measurement trajectory of FIG. 2A.

FIG. 4 depicts a graph illustrating a height deformation as a function of position at the substrate, which is a direct result of the acceleration forces acting on the substrate support and the substrate supported by the substrate support. As the substrate (and substrate support) acceleration decreases, it is observed that the height deformation amplitude decreases, as illustrated by the left hand side of the curve. As the velocity of the substrate becomes constant, the force induced height deformations are relatively small or even negligible with respect to the deformations observed during acceleration and/or deceleration. The height deformations of the substrate at constant velocity is represented by the flat (horizontal) middle section of the curve as plotted in FIG. 4. When the substrate velocity decreases (referring to FIG. 2A, thus the time period after t2), the substrate height deformations increase in amplitude, as illustrated by the righthand side of the plotted curve.

Investigations revealed that at least a portion of the height deformations that are governed by forces as a result of the acceleration and the deceleration of the substrate (and substrate support) are repeatable height deformations, or at least reproducible height deformations. The repeatability of the height deformations brings the opportunity of calibrating and correcting for these acceleration and deceleration induced deformations.

Figure 5A:
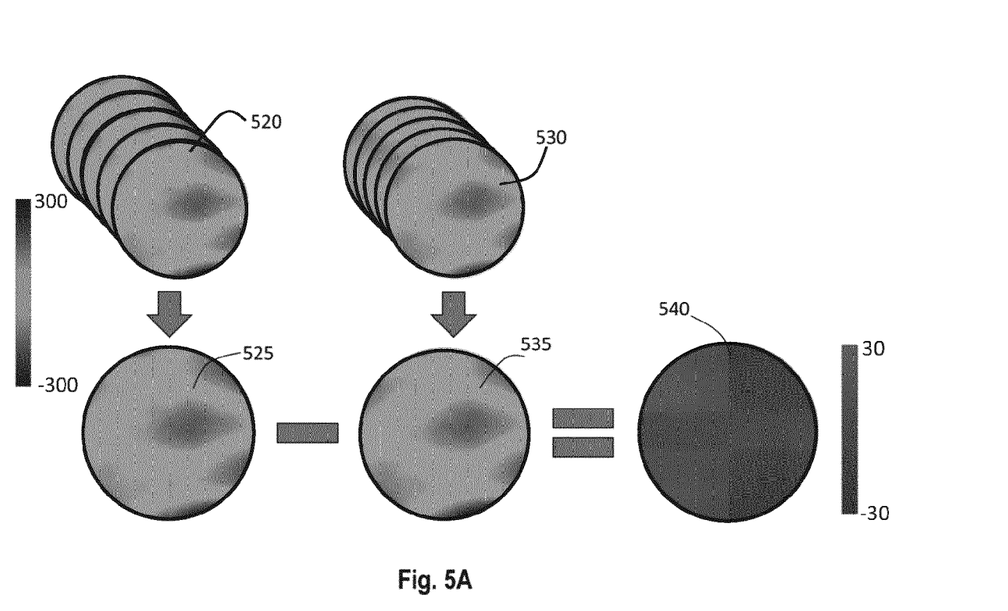
FIG. 5A illustrates a construction of a correction map according an embodiment the present invention.
Figure 5B:
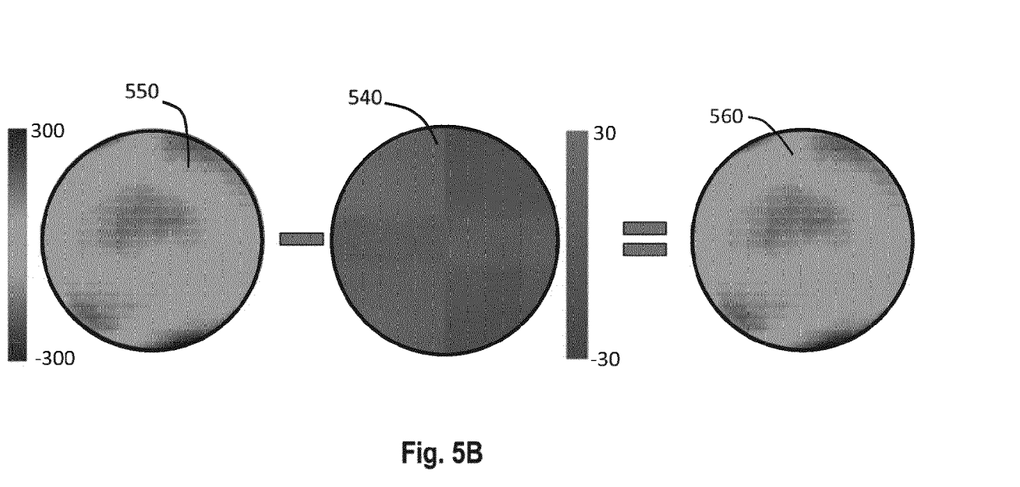
FIG. 5B illustrates the use of the correction map according an embodiment of the present invention.

The present invention may provide a method of applying a correction to a measured height level map, and herewith correcting or compensating for distortions and or height deformations as a result of the non-constant velocity of the substrate with respect to the height level sensor during measurement of the substrate height. FIGS. 5A and 5B illustrate an embodiment of a correction method according the present invention.

During the overall height measurements by means of the height level sensor, the substrate has a non-constant velocity with respect to the height level sensor. In a situation wherein the height level of the substrate is measured in scan-strokes, for example in the Y-direction as illustrated in FIG. 2B, the actual velocity of the substrate, at the moment a first measurement sample is taken for a single scan-stroke, depends on the location of the scan at the substrate, for example the position in the X-direction. That is, when the same trajectories (and timing charts) are used of each scan-stroke, the actual velocity of the substrate at the start of the height measurement of each scan-stroke (thus at the edge of the substrate) depends on the time that has lapsed between the start of the acceleration and the moment of interaction of the substrate with the height level sensor (start of the first height measurement at, for example, the substrate edge). Referring to FIG. 2B, an initial (or first) measurement of a scan-stroke at the centre of the substrate (in X-direction) will be done at a lower velocity than an initial measurement of a scan-stroke away from the centre of the substrate (in X-direction), for example, the outer most scan-strokes as illustrated in FIG. 2B.

In order to correct or to compensate for the deformation induced height error due to the velocity difference, a correction map is constructed. Construction of this correction map is based on a plurality of height maps. A first set of height maps is obtained with one or more substrates, e.g., bare substrates. A first measurement series is performed with the one or more substrate moving with, at least partially, a non-constant velocity, to obtain the first height maps Timing charts as, for example, illustrated in FIG. 2A may be used during the measurements. The first set of height maps are obtained for a relatively low end-velocity, and referred as low-velocity height maps 530. For example, the one or more substrates may have a first maximum end-velocity of approximately 1 m/s. This may be the velocity that the substrate reaches at the constant velocity period during the scan. A second set of height maps is obtained with one or more substrates, e.g., the same bare substrates as used for the low-velocity height maps 530. A second measurement series is performed with the one or more substrate moving with, at least partially, a non-constant velocity, to obtain the second height maps. The second set of height maps are obtained for a relatively high end-velocity, and referred as high-velocity height maps 520. For example, the one or more substrates may have a second maximum end-velocity of approximately 3 m/s.

In another embodiment, the first measurement series is performed with the one or more substrate moving with a constant velocity to obtain the first height maps. Constructing the first height maps based on measurements at constant velocity may have the advantage that dynamical effects, induced by accelerations (and decelerations) can be eliminated or suppressed more efficiently.

An average low-velocity height map 535 is constructed based on the one or more low-velocity height maps 530. An average high-velocity height map 525 is constructed based on the one or more high-velocity height maps 520. The one or more low-velocity and or high-velocity heights maps may include height information regarding the actual scan direction. That is, so-called scan-up and scan-down effects may affect the measured height level of the substrate. For obtaining the average low-velocity height map 535 and or the high-velocity height map 525, corrections or compensations for the scan-up and scan-down effects, and/or any other position dependent effects, may be taken into account.

With the construction of the average low-velocity height map 535 and the average high-velocity height map 525, the impact of an increased substrate velocity can be determined. By subtracting the average low-velocity height map 535 from the average high-velocity height map 525, the impact can be calculated. The difference between the average low-velocity height map 535 and the average high-velocity height map 525 forms a correction map 540, as illustrated by FIG. 5A. The obtained correction map 540 reveals the height deformation as a result of increased acceleration amplitude, similar as illustrated by the graph of FIG. 4. As may be noticed, the correction map 540 shows an area with relatively low height deformation, which corresponds to measurement results that are obtained at a constant velocity, similar as the middle section of the curve as is illustrated in FIG. 4.

FIG. 5B illustrates how the correction map 540 may be used to correct height level maps that are obtained at, for example, production substrates (or substrates that are used in a lithographic exposure sequence). Before exposure of a production substrate the height level of the production substrate is measured by means of a height level sensor, resulting in a height level map of the production substrate (or production substrate height map) 550. With the substrate height level being measured at a (at least partially) non-constant velocity, with a maximum end-velocity, the production substrate height map 550 may be affected by acceleration induced deformations. Corrections (or compensation) for the induced deformations may be applied by subtracting the correction map 540 from the production substrate height map 550, herewith calculating corrected substrate height map 560. In this case, the second maximum end-velocity (high-velocity) that is used for obtaining the average high-velocity height map 525 corresponds to the maximum end-velocity as being used during height measurements of the production substrate to create the production substrate height map 550. Herewith, height variations or deformations as experienced with the, for example, bare substrates are similar or comparable with the expected height variations for the production substrate due to the non-constant velocity.

It may be advantageous to use more than one timing charts, with each timing chart corresponding to, for example, a different maximum velocity and or acceleration. In addition, creating one or more correction maps 540 each for the different timing charts may be beneficial to apply a correction map 540 suitable for and corresponding to the measurement setting as used during the height measurement of one or more production substrates. The one or more correction maps 540 may be stored locally at a lithographic apparatus (e.g, the lithographic apparatus LA as illustrated by FIG. 1) or may be stored remotely. The one or more correction maps 540 may be accessible during exposure sequence at the lithographic apparatus LA.

The one or more correction maps 540 may be used to compare acceleration induced height deformations of different substrate supports. The different substrate supports may be arranged in different lithographic apparatuses or may be arranged in a single lithographic apparatus. A difference between two or more correction maps 540 may be used for (so-called) chuck-to-chuck matching or machine-to-machine matching. The correction map 540 may be a calibration map.

A lithographic apparatus comprising, for example, two substrate supports may require at least one correction map per substrate support and measurement setting (timing chart). Thus, for one timing chart at least two correction maps 540 may be stored.

The correction map 540 may also be created at different moments in time during the lifetime of the substrate support (or during the lifetime or the lithographic apparatus). A change of the correction map 540 over time, may be used for monitoring the substrate support performance. This may trigger corrective actions to secure the performance of the lithographic apparatus.

In an embodiment of the invention, a method is used for calculating a corrected substrate height map 560 of a first substrate using a height level sensor, comprising the steps of: sampling the first substrate by means of the height level sensor with the first substrate moving with a first velocity, the first velocity is a first at least partially non-constant velocity of the first substrate with respect to the height level sensor, to generate a first height level data, generating a first height map 550 (or the production substrate height map) based on the first height level data, calculating a corrected substrate height map 560 by subtracting a correction map 540 from the first height map 550, wherein the correction map 540 is calculated from the difference between a first velocity height map (e.g., the average high-velocity height map 525) and a second velocity height map (e.g., the average low-velocity height map 535).

The first velocity height map is a height map of at least a second substrate measured with velocity corresponding to the first velocity. The second velocity height map is a height map of at least the second substrate measured a second velocity. The second velocity is a second at least partially non-constant velocity of the second substrate with respect to the height level sensor, and has a lower amplitude with respect to the first velocity.

In addition, the sampling is at least partially performed at moments in time at which the first substrate and the height level sensor accelerate with respect to each other.

In another embodiment of the invention, a method is used for calculating a corrected substrate height map 560 of a first substrate using a height level sensor, comprising the steps of: sampling the first substrate by means of the height level sensor with the first substrate moving with a first velocity, the first velocity is a first constant velocity of the first substrate with respect to the height level sensor, to generate a first height level data, generating a first height map 550 (or the production substrate height map) based on the first height level data, calculating a corrected substrate height map 560 by subtracting a correction map 540 from the first height map 550, wherein the correction map 540 is calculated from the difference between a first velocity height map (e.g., the average high-velocity height map 525) and a second velocity height map (e.g., the average low-velocity height map 535).

In an embodiment of the invention, a system for measuring a height may be used that comprises a height level sensing controller configured to receive first height level data for a first substrate, to generate first height map data 550 based on the first height level data, and to correct the first height map data 550 with correction map data 540, wherein the correction map data 540 is calculated from a difference between a first velocity height map 525 and a second velocity height map 535.

In an embodiment, the first velocity height map 525 may be derived from at least one height map 520 of at least a second substrate measured with a velocity corresponding to the first velocity, and the second velocity height map 535 may be derived from at least one height map 530 of at least the second substrate measured with a second velocity. The second velocity may be a second at least partially non-constant velocity of a lower amplitude with respect to the first velocity.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
 sampling a first substrate using a height level sensor with the first substrate moving with a first velocity, the first velocity being a first at least partially non-constant velocity of the first substrate with respect to the height level sensor, to generate a first height level data;
 generating a first height map based on the first height level data; and
 calculating a corrected substrate height map by subtracting a correction map from the first height map, wherein the correction map is calculated from a difference between a first velocity height map and a second velocity height map.

2. The method of claim 1, wherein:
 the first velocity height map is derived from at least one height map of at least a second substrate measured with a velocity corresponding to the first velocity, and
 the second velocity height map is derived from at least one height map of at least the second substrate measured with a second velocity, the second velocity being a second at least partially non-constant velocity of a lower amplitude with respect to the first velocity.

3. The method of claim 1, wherein the sampling is at least partially performed at moments in time at which the first substrate and the height level sensor accelerate with respect to each other.

4. A system, comprising:
 a height level sensing controller configured to:
  receive first height level data for a first substrate;
  generate first height map data based on the first height level data; and
  correct the first height map data with correction map data, wherein the correction map data is calculated from a difference between a first velocity height map and a second velocity height map.

5. The system of claim 4, wherein:
 the first velocity height map is derived from at least one height map of at least a second substrate measured with a velocity corresponding to the first velocity, and
 the second velocity height map is derived from at least one height map of at least the second substrate measured with a second velocity, the second velocity being a second at least partially non-constant velocity of a lower amplitude with respect to the first velocity.

6. A lithographic apparatus comprising the system of claim 4.

* * * * *